United States Patent
Kim

(10) Patent No.: US 9,530,741 B2
(45) Date of Patent: Dec. 27, 2016

(54) SEMICONDUCTOR PACKAGES HAVING RESIDUAL STRESS LAYERS AND METHODS OF FABRICATING THE SAME

(71) Applicant: SAMSUNG ELECTRONICS CO., LTD., Suwon-Si, Gyeonggi-Do (KR)

(72) Inventor: Youngbae Kim, Gyeonggi-do (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/712,959

(22) Filed: May 15, 2015

(65) Prior Publication Data

US 2016/0005698 A1    Jan. 7, 2016

(30) Foreign Application Priority Data

Jul. 7, 2014  (KR) .................. 10-2014-0084654

(51) Int. Cl.
*H01L 23/00* (2006.01)
*H01L 23/31* (2006.01)
*H01L 25/10* (2006.01)

(52) U.S. Cl.
CPC .......... *H01L 23/562* (2013.01); *H01L 25/105* (2013.01); *H01L 23/3135* (2013.01); *H01L 2224/16225* (2013.01); *H01L 2224/48091* (2013.01); *H01L 2224/48227* (2013.01); *H01L 2224/73253* (2013.01); *H01L 2924/15311* (2013.01); *H01L 2924/1815* (2013.01); *H01L 2924/18161* (2013.01); *H01L 2924/3511* (2013.01)

(58) Field of Classification Search
CPC ... H01L 23/562; H01L 25/105; H01L 23/3114
See application file for complete search history.

(56) References Cited

U.S. PATENT DOCUMENTS

| | | | |
|---|---|---|---|
| 7,064,420 B2 | 6/2006 | Han et al. | |
| 7,256,353 B2 | 8/2007 | Osanai et al. | |
| 7,851,894 B1 * | 12/2010 | Scanlan | H01L 23/3128 257/659 |
| 8,421,197 B2 | 4/2013 | Do et al. | |
| 8,846,500 B2 | 9/2014 | Lysacek et al. | |
| 2003/0038358 A1 | 2/2003 | Chiu et al. | |

(Continued)

FOREIGN PATENT DOCUMENTS

| KR | 1019970072338 | 11/1997 |
|---|---|---|
| KR | 1020010018070 | 3/2001 |

(Continued)

*Primary Examiner* — Peniel M Gumedzoe
(74) *Attorney, Agent, or Firm* — F. Chau & Associates, LLC

(57) ABSTRACT

A semiconductor package is provided. The semiconductor includes a lower package and an upper package stacked on the lower package. The lower package includes a package substrate, a semiconductor chip, a mold layer and a residential stress layer. The package substrate has upper and lower surfaces. The semiconductor chip is disposed on the upper surface of the package substrate. The mold layer encapsulates the semiconductor chip. The residual stress layer is disposed on the semiconductor chip. The residual stress layer includes a plastically deformed surface. The residual stress layer has a residual stress to counterbalance warpage of the lower package.

20 Claims, 23 Drawing Sheets

(56) References Cited

U.S. PATENT DOCUMENTS

| | | | |
|---|---|---|---|
| 2011/0316151 A1* | 12/2011 | Ozawa | H01L 21/563 257/737 |
| 2012/0196075 A1 | 8/2012 | Takahashi et al. | |
| 2013/0178016 A1* | 7/2013 | Yim | H01L 24/97 438/108 |
| 2013/0292848 A1* | 11/2013 | Na | H01L 23/5226 257/774 |
| 2015/0155243 A1* | 6/2015 | Chen | H01L 23/562 257/724 |

FOREIGN PATENT DOCUMENTS

| | | |
|---|---|---|
| KR | 1020020035939 | 5/2002 |
| KR | 1020080076621 | 8/2008 |
| KR | 1020090047130 | 5/2009 |

\* cited by examiner

Positive warpage

Negative warpage

SEMICONDUCTOR PACKAGES HAVING RESIDUAL STRESS LAYERS AND METHODS OF FABRICATING THE SAME

CROSS-REFERENCE TO RELATED APPLICATION

This application claims priority under 35 U.S.C. §119 to Korean Patent Application 10-2014-0084654, filed on Jul. 7, 2014 in the Korean Intellectual Property Office, the disclosure of which is incorporated by reference herein in its entirety.

TECHNICAL FIELD

The present inventive concept relates to semiconductor packages having residual stress layers and methods of fabricating the same.

DISCUSSION OF RELATED ART

In the semiconductor industry, various package technologies have been developed to meet demands for large storage, thin thickness, and small size of semiconductor devices and/or electronic appliances. Warpage of semiconductor package may occur due to heat applied thereto.

SUMMARY

According to an exemplary embodiment of the present inventive concept, a semiconductor package is provided. The semiconductor includes a lower package and an upper package stacked on the lower package. The lower package includes a package substrate, a semiconductor chip, a mold layer and a residential stress layer. The package substrate has upper and lower surfaces. The semiconductor chip is disposed on the upper surface of the package substrate. The mold layer encapsulates the semiconductor chip. The residual stress layer is disposed on the semiconductor chip. The residual stress layer includes a plastically deformed surface. The residual stress layer has a residual stress to counterbalance warpage of the lower package.

According to an exemplary embodiment of the present inventive concept, a semiconductor package is provided. A lower package includes a lower semiconductor chip, a lower package substrate and a lower mold layer. The lower semiconductor chip is mounted on the lower package substrate. The lower mold layer encapsulates the lower semiconductor chip. An upper package is stacked on the lower package. The upper package includes an upper semiconductor chip, an upper package substrate and an upper mold layer. The upper semiconductor chip is mounted on the upper package substrate. The upper mold layer encapsulates the upper semiconductor chip. A residual stress layer has a residual stress to counterbalance warpage of the lower package. The residual stress layer is in contact with the lower package. The residual stress layer includes a plurality of first dents.

According to an exemplary embodiment of the present inventive concept, a method of fabricating a semiconductor package is provided. A lower package is formed. An upper package is stacked on the lower package. A connection terminal is formed to electrically connect the lower and upper packages to each other. To form the lower package, a lower semiconductor chip is mounted on an upper surface of the lower package substrate. A mold layer is formed on the upper surface of the lower package substrate to encapsulate the lower semiconductor chip and expose an upper surface of the lower semiconductor chip. A seed layer covering the lower semiconductor chip and the lower mold layer is formed. A shot-peening treatment is performed on a surface of the seed layer to plastically deform the surface of the seed layer. The seed layer having the plastically deformed surface is patterned to form a residual stress layer.

According to an exemplary embodiment of the present inventive concept, a method of fabricating a semiconductor package is provided. A lower package is provided. The lower package includes a lower package substrate, a lower semiconductor chip mounted on the lower package substrate, and a lower mold layer encapsulating the lower semiconductor chip. An upper package is stacked on the lower package. The upper package includes an upper package substrate, an upper semiconductor chip mounted on the upper package substrate, and an upper mold layer encapsulating the upper semiconductor chip. A residual stress layer is formed between the upper and lower packages. The residual stress layer has a residual stress to counterbalance warpage of the lower package. To form the residual stress layer, a metal seed layer is formed on the lower package. A shot peening treatment is performed on a surface of the metal seed layer to plastically deform the surface of the metal seed layer. The metal seed layer having the plastically deformed surface is patterned to form the residual stress layer. The residual stress layer exposes the lower mold layer.

According to an exemplary embodiment of the present inventive concept, a semiconductor package includes a lower package and an upper package stacked on the lower package. The lower package includes a surface having a plurality of first dents.

BRIEF DESCRIPTION OF THE DRAWINGS

These and other features of the inventive concept will become more apparent by describing in detail exemplary embodiments thereof with reference to the accompanying drawings of which:

FIG. 7C is an enlarged cross sectional view of a portion of FIG. 7B;

FIG. 8C is an enlarged cross sectional view of a portion of FIG. 8B;

DETAILED DESCRIPTION OF EXEMPLARY EMBODIMENTS

Figure 1A:
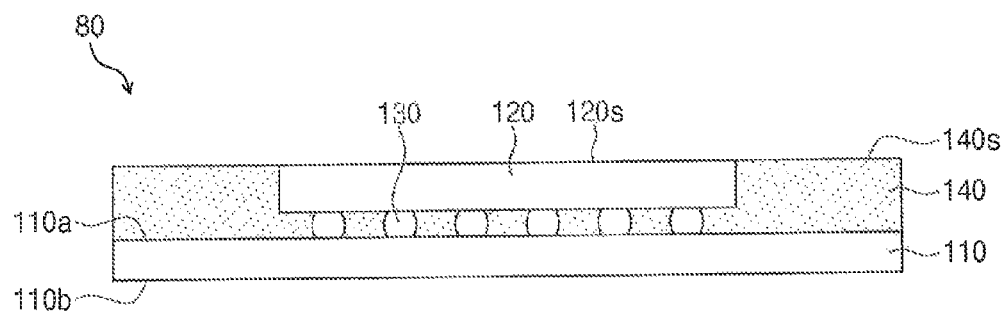
FIGS. 1A to 1C are cross sectional views illustrating a method of fabricating a semiconductor package using a shot peening treatment according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being on another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 1B:
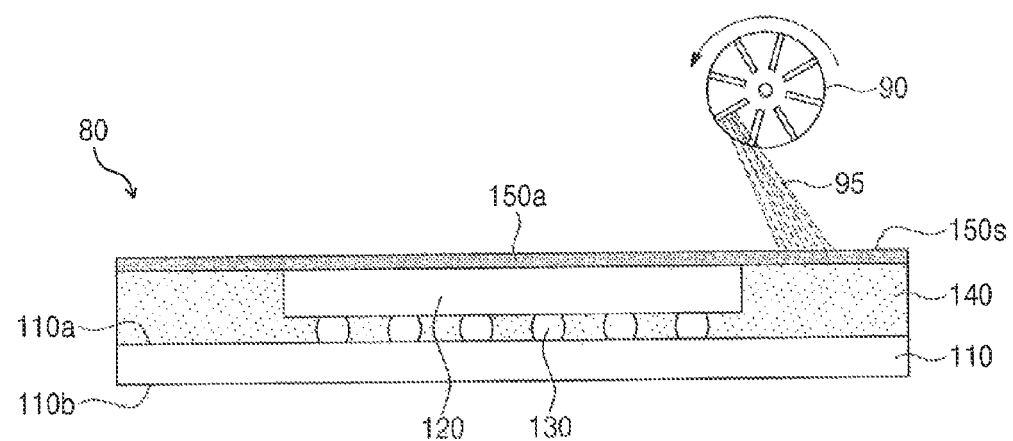
Figure 1C:
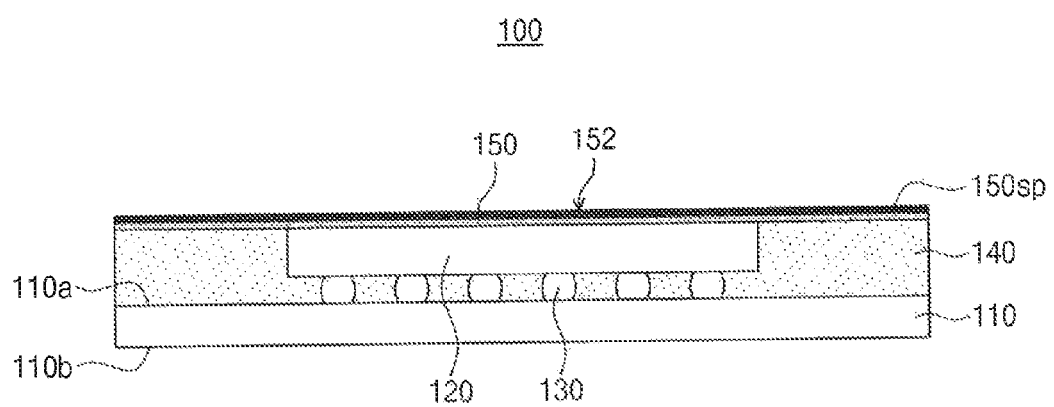
Figure 2A:
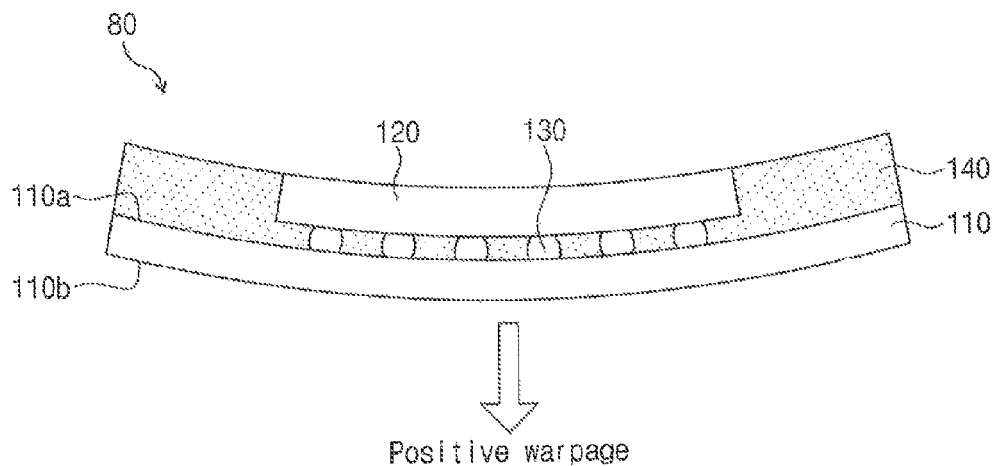
FIGS. 2A and 2B are cross sectional views illustrating a warpage of semiconductor package.
Figure 2B:
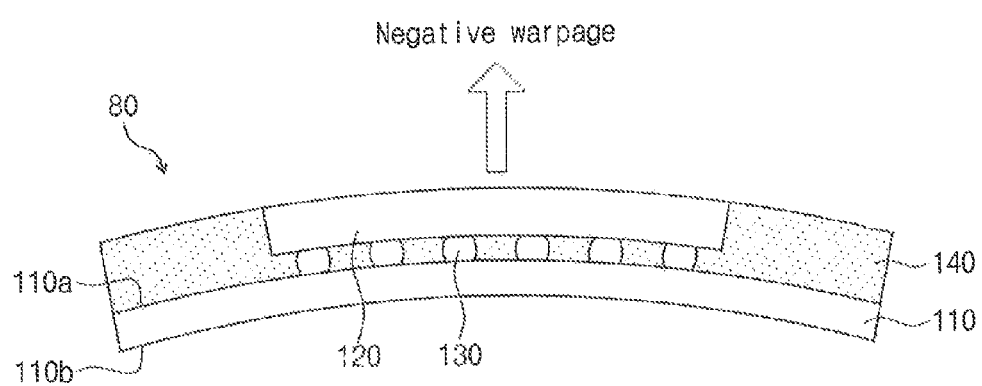
Figure 3A:
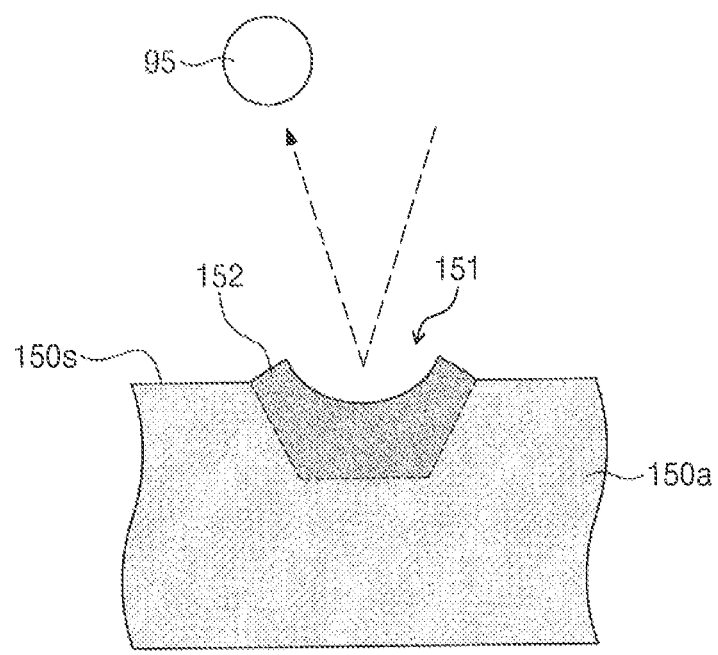
FIGS. 3A and 3B are cross sectional views illustrating a shot peening treatment according to an exemplary embodiment of the present inventive concept.
Figure 3B:
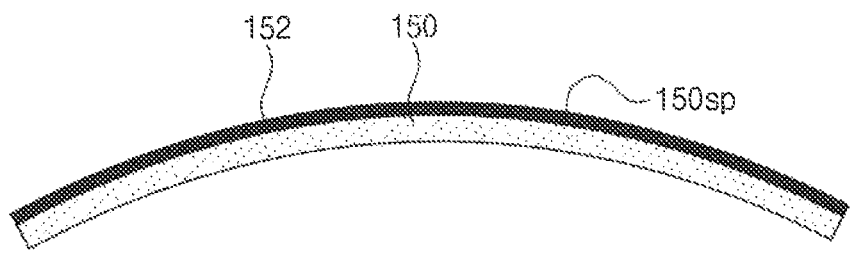

FIGS. 1A to 1C are cross sectional views illustrating a method of fabricating a semiconductor package using a shot peening treatment according to an exemplary embodiment of the present inventive concept. FIGS. 2A and 2B are cross sectional views illustrating warpage of a semiconductor package. FIGS. 3A and 3B are cross sectional views illustrating a shot peening treatment according to an exemplary embodiment of the present inventive concept.

Referring to FIG. 1A, a semiconductor chip 80 may be fabricated by mounting a semiconductor chip 120 on a package substrate 110 and forming a mold layer 140 to encapsulate the semiconductor chip 120. The package substrate 110 may be a printed circuit board having an upper surface 110a and a lower surface 110b opposite the upper surface 110a. The semiconductor chip 120 may be a memory chip, a logic chip, or a combination thereof. The semiconductor chip 120 is mounted on the upper surface 110a of the package substrate 110 in a flip chip bonding manner in which an active surface of the semiconductor chip 120 faces the package substrate 110 and is electrically connected to the package substrate 110 by terminals 130 such as solder balls or solder bumps. The mold layer 140 may be formed by a MUF (molded under fill) process using an EMC (epoxy mold compound). The mold layer 140 exposes the semiconductor chip 120. The mold layer 140 includes a surface 140s substantially coplanar with a surface 120s of the semiconductor chip 120. The surface 120s of the semiconductor chip 120 may be an inactive surface. Alternatively, the mold layer 140 may completely encapsulate the semiconductor chip 120. In this case, the surface 120s of the semiconductor chip 120 need not be exposed.

The semiconductor package 80 may include various materials (e.g., silicon, metal, solder resist, etc.) having different coefficients of thermal expansions (CTEs). The differences in CTEs may cause warpage of the semiconductor package 80 when the semiconductor package 80 is subjected to heat or self-heating applied thereto. As shown in FIG. 2A, the semiconductor package 80 has positive warpage in which the semiconductor package 80 convexly warps toward the lower surface 110b of the package substrate 110. Alternatively, as shown in FIG. 2B, the semiconductor package 80 has negative warpage in which the semiconductor package 80 convexly warps toward the upper surface 110a of the package substrate 110. For example, when the package substrate 110 has a high coefficient of thermal expansion relative to those of the semiconductor chip 120 and/or mold layer 140, the semiconductor package 80 may have positive warpage as illustrated in FIG. 2A.

Referring to FIG. 1B, a seed layer 150a is formed on the semiconductor package 80 and then a shot peening treatment is performed on the seed layer 150a. The seed layer 150a may include metal, ceramic, polymer, etc. For example, the seed layer 150a may be a metal layer, such as copper layer, having a thickness of about 10 nm more or less. The seed layer 150a completely covers the semiconductor chip 120. Alternatively, the seed layer 150a may partially cover the semiconductor chip 120.

The shot peening treatment may be performed by using an injection apparatus 90 for colliding shots 95 such as metal particles, ceramic particles, or glass particles at high speed against a surface 150s of the seed layer 150a. The shot peening treatment may be performed at a room temperature (e.g., about 25° C.).

Referring to FIG. 1C, the shot peening treatment may transform the seed layer 150a into a residual stress layer 150 having a plastically deformed or shot-peening treated surface 150sp. As shown in FIG. 3A, the shots 95 that are ejected from the injection apparatus 90 hit the surface 150s of the seed layer 150a at such a speed that stress applied to the surface 150s by the shots 95 exceeds yield stress of the seed layer 150a. In this case, the high-speed impact of the shot 95 leaves a dent 151 on the surface 150s of the seed layer 150a, creating a plastification zone 152 around the dent 151. As shown in FIG. 3B, the shot peening treatment may convert the seed layer 150a into the residual stress layer 150 having a residual stress which may cause the surface 150sp to convexly bend. For example, the residual stress layer 150 may be convexly bent toward the surface 150sp.

As illustrated above, the shot peening treatment fabricates a semiconductor package 100 having the residual stress layer 150. The surface 150sp of the residual stress layer 150 includes a plurality of dents 151 as described with reference to FIG. 3A. The residual stress layer 150 formed of metal may serve as a heat radiating layer.

The thickness of the plastification zone 152 may mainly depend on the collision speed. The degree of plastic deformation of the plasticification zone 152 may mainly depend on a process time of the shot peening treatment. As a result, the residual stress in the residual stress layer 150 may increase with process time and/or collision speed.

The residual stress layer 150 may counterbalance the warpage of the semiconductor package 100. For example, the positive warpage of the semiconductor package 100 may be eliminated or reduced by the residual stress layer 150 as illustrated with reference to FIGS. 4A to 4C.

Figure 4A:
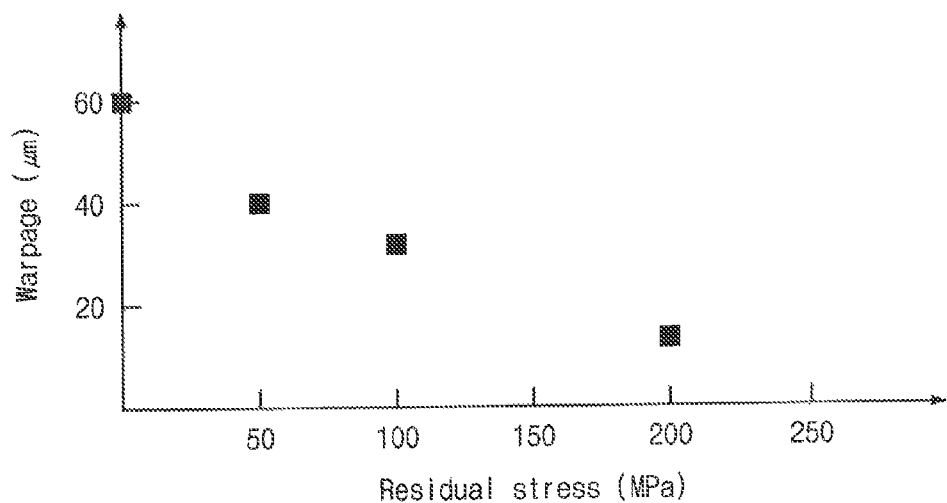
FIG. 4A shows a graph showing the relationship between a residual stress and a warpage of semiconductor package according to an exemplary embodiment of the present inventive concept.
Figure 4B:
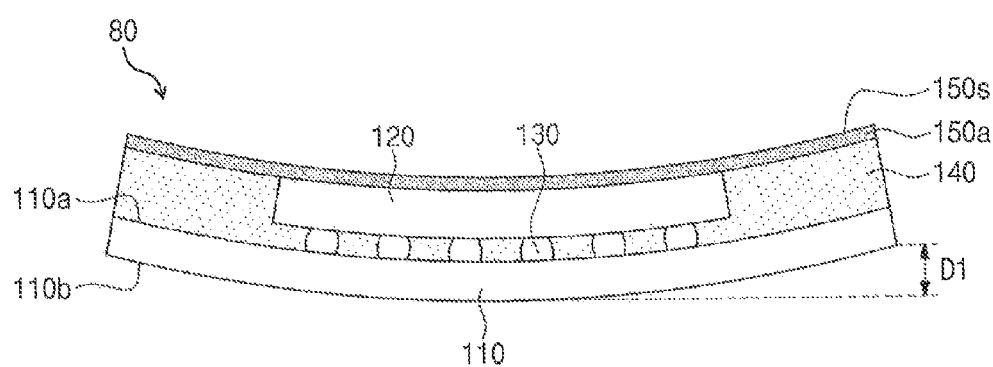
FIGS. 4B and 4C are cross sectional views illustrating effects of shot peening treatment according to an exemplary embodiment of the present inventive concept.
Figure 4C:
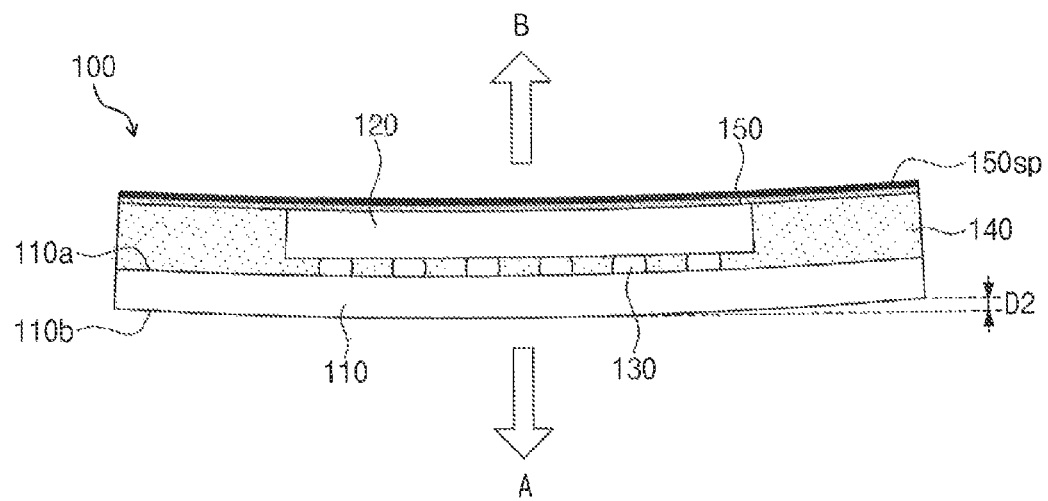

FIG. 4A shows a graph showing the relationship between a residual stress and warpage of a semiconductor package according to an exemplary embodiment of the present inventive concept. FIGS. 4B and 4C are cross sectional views illustrating the effects of shot peening treatment on the warpage of a semiconductor package according to an exemplary embodiment of the present inventive concept.

Referring to FIG. 4A, the semiconductor package 100 having the residual stress layer 150 of FIG. 1C has reduced warpage relative to the semiconductor package 80 having no residual stress layer 150 of FIG. 1A or 1B. This will be explained with reference to FIGS. 4B and 4C. It will be understood that embodiments of the present inventive concept are not limited to specific values in the graph of FIG. 4A.

Referring to FIG. 4B, the seed layer 150a is not subject to the Shot peening treatment. The seed layer 150a may have no residual stress caused by the shot peening treatment. The semiconductor package 80 without residual stress has positive warpage at a high temperature condition (e.g., about 240° C.). The term "warpage" may mean a difference D1 in height between center and edge portions of the lower surface 110b of the package substrate 110 as shown in FIG. 4B. For example, the semiconductor package 80 having the seed layer 150a without the residual stress may warp to have a difference D1 of about 60 μm, for example. The semiconductor package 80 having no seed layer 150a of FIG. 1A may exhibit a behavior identical or similar to that of the semiconductor package 80 of FIG. 4B.

Referring to FIG. 4C, the residual stress layer 150 having the plastically deformed or shot-peening treated surface 150sp may exert stress to warp the semiconductor package 100 toward a direction B opposite a bending direction A of the package surface 110. For example, when the semiconductor package 100 has positive warpage toward the direction A, the residual stress layer 150 may provide the semiconductor package 100 with stress toward the direction B. According to the relative magnitude of the opposite stresses, the positive warpage of the semiconductor package 100 may be eliminated or reduced.

The semiconductor package 100 with the residual stress layer 150 may have a difference D2 less than the difference D1. For example, when the residual stress layer 150 has a residual stress of about 200 MPa, the semiconductor package 100 may be bent to have a difference D2 of about 15 μm at a high temperature condition.

FIGS. 5A to 5D are cross sectional views illustrating a method of fabricating a semiconductor package according to an exemplary embodiment of the present inventive concept.

Figure 5A:
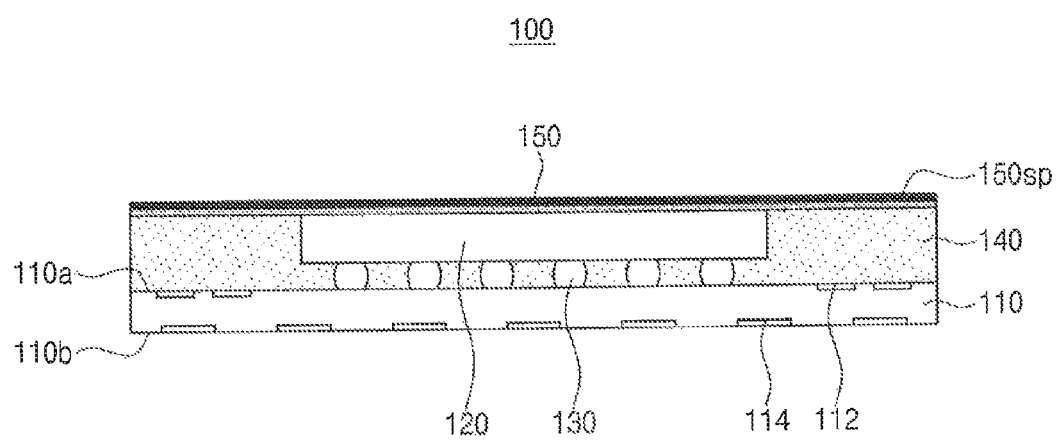
FIGS. 5A to 5D are cross sectional views illustrating a method of fabricating a semiconductor package according to an exemplary embodiment of the present inventive concept.

Referring to FIG. 5A, by performing processes identical or similar to those described with reference to FIGS. 1A to 1C, a semiconductor package 100 includes a package substrate 110, a semiconductor chip 120 on the upper surface 110a of the package substrate 110, a mold layer 140 encapsulating the semiconductor chip 120, and a residual stress layer 150 having a shot-peening treated surface 150sp. An upper pad 112 is formed on the upper surface 110a of the package substrate 110, and a lower pad 114 is formed the lower surface 110b of the package substrate 110.

Figure 5B:
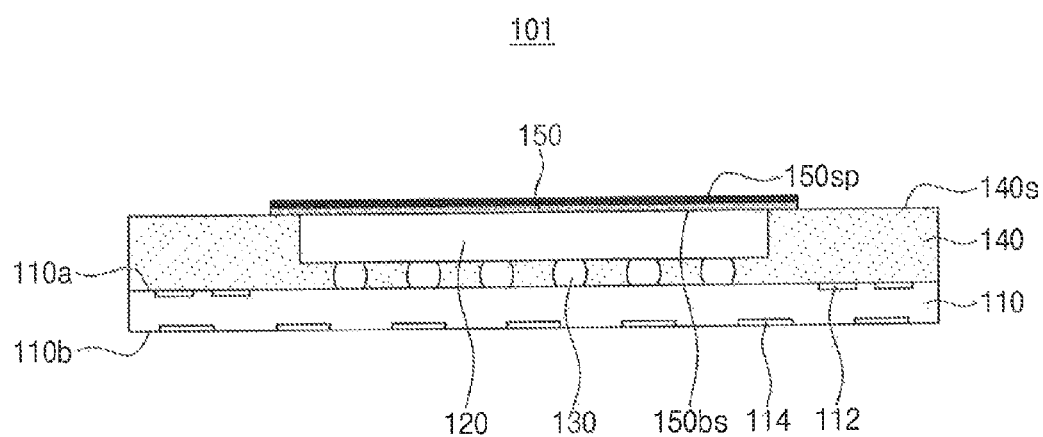

Referring to FIG. 5B, a first lower package 101 is formed by partially exposing the mold layer 140 of the semiconductor package 100. For example, an etching process may be performed to partially remove the residual stress layer 150 to expose a portion of the mold layer 140. The partial removing of the residual stress layer 150 may expose the surface 140s of the mold layer 140. The residual stress layer 150 covers the semiconductor chip 120, partially exposing the mold layer 140. For example, the residual stress layer 150 covering the semiconductor chip 120 extends beyond a boundary between the semiconductor chip 120 and the mold layer 140, to partially cover the surface 140s of the mold layer 140. The plurality of dents 151 of FIG. 3A may be placed on the shot-peening treated surface 150sp of the residual stress layer 150. The surface 150sp of the residual stress layer 150 may have high roughness relative to the surface 140s of the mold layer 140. The surface 150sp of the residual stress layer 150 may have high roughness relative to a bottom surface 150bs of the residual stress layer 150.

Figure 5C:
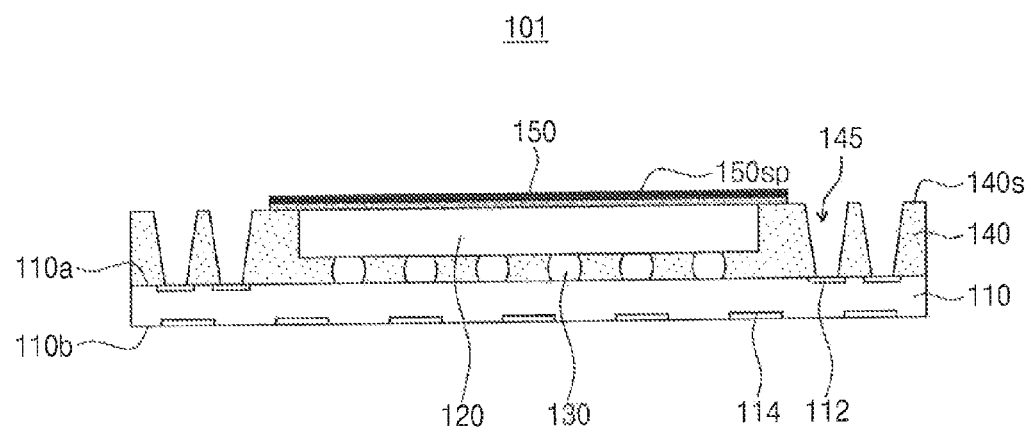

Referring to FIG. 5C, a mold hole 145 is formed in the exposed surface of the mold layer 140. For example, the mold hole 145 may be formed by etching or drilling the mold layer 140. The mold hole 140 penetrates the mold layer 140 to expose the upper pad 112 of the package substrate 110.

Figure 5D:
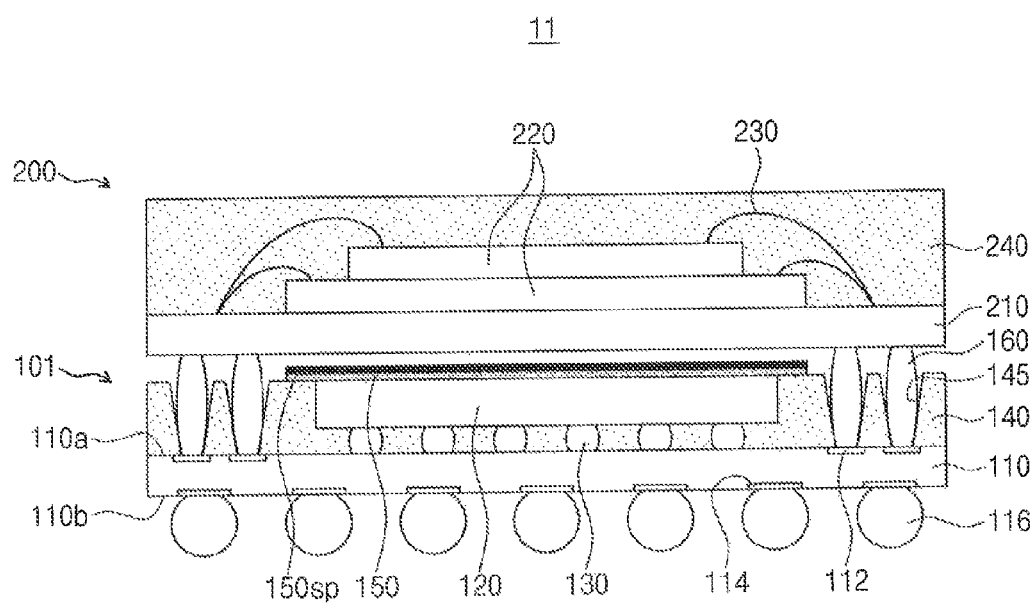

Referring to FIG. 5D, an upper package 200 is stacked on the first lower package 101 using a connection terminal 160 such as a solder ball. The connection terminal 160 is formed in the mold hole 145. The connection terminal 160 is coupled to the upper pad 112. An external terminal 116 such as a solder ball is formed on the lower surface 110b of the package substrate 110 to be coupled to the lower pad 114.

The upper package 200 includes at least one semiconductor chip 220 mounted on a package substrate 210 and a mold layer 240 encapsulating the at least one semiconductor chip 220. The semiconductor chip 220 is electrically connected to the package substrate 210 by a bonding wire 230. For example, the semiconductor chip 120 of the first lower package 101 may be a logic chip, and the semiconductor chip 220 of the upper package 200 may be a memory chip.

Through the processes described above, a first semiconductor package 11 having a package-on-package type is fabricated to include the upper package 200 stacked on the first lower package 101 that are electrically connected to each other by the connection terminal 160.

The residual stress layer 150 may allow the first lower package 101 to have less warpage as described with reference to FIGS. 4A to 4C. As such, warpage of the first semiconductor package 11 may be eliminated or reduced. Further, failure or damage of the connection terminal 160 caused by the warpage of the first lower package 101 may also be eliminated or reduced.

FIGS. 6A to 6D are cross sectional views illustrating a method of fabricating a semiconductor package according to an exemplary embodiment of the present inventive concept.

Figure 6A:
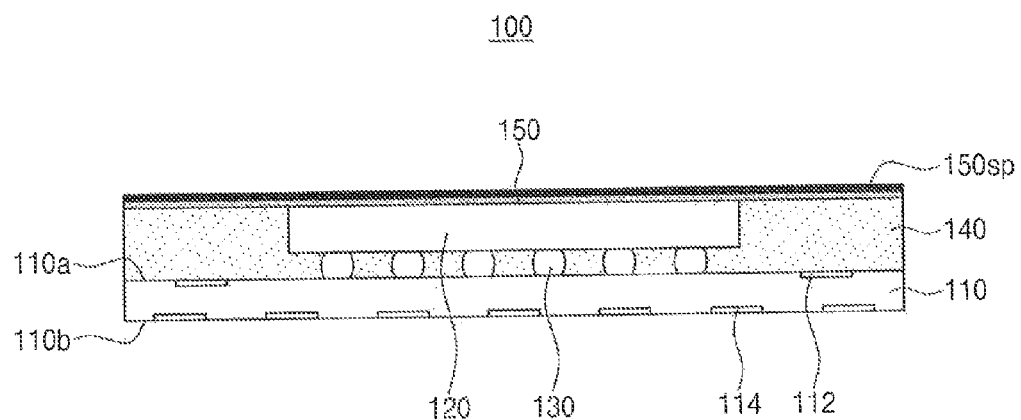
FIGS. 6A to 6D are cross sectional views illustrating a method of fabricating a semiconductor package according to an exemplary embodiment of the present inventive concept.

Referring to FIG. 6A, by performing processes identical or similar to those described with reference to FIGS. 1A to 1C, a semiconductor package 100 includes a semiconductor chip 120 on the upper surface 110a of a package substrate 110, a mold layer 140 encapsulating the semiconductor chip 120, and a residual stress layer 150 having a shot-peening treated surface 150sp. An upper pad 112 and a lower pad 114 are formed respectively on the upper surface 110a and the lower surface 110b of the package substrate 110.

Figure 6B:
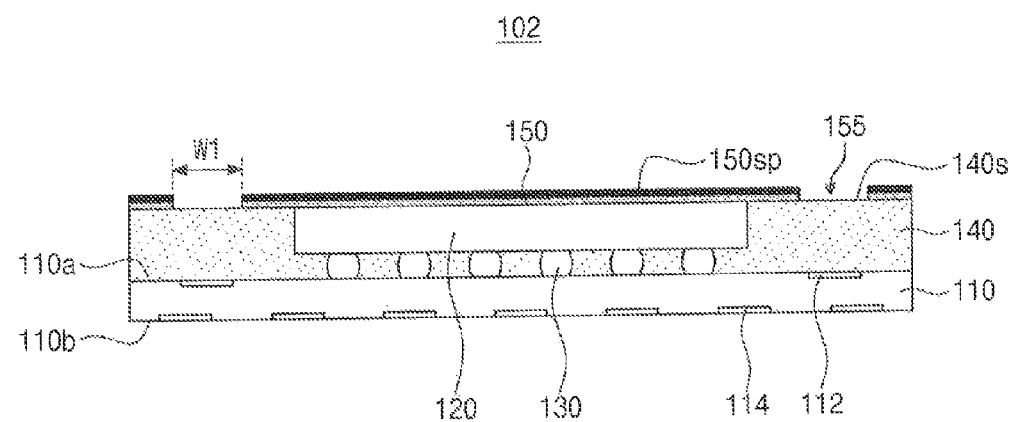

Referring to FIG. 6B, a second lower package 102 is formed by partially exposing the mold layer 140 from the semiconductor package 100 of FIG. 6A. For example, an etching process may be performed to partially remove the residual stress layer 150 to form an opening 155 exposing a portion of the mold layer 140. The opening 155 has a first size W1, for example. The opening 155 may have a circular shape in plan view. In this case, the first size W1 may be referred to as a first diameter. The opening 155 partially exposes the surface 140s of the mold layer 140. The opening 155 is vertically aligned with the upper pad 112 of the package substrate 110.

Figure 6C:
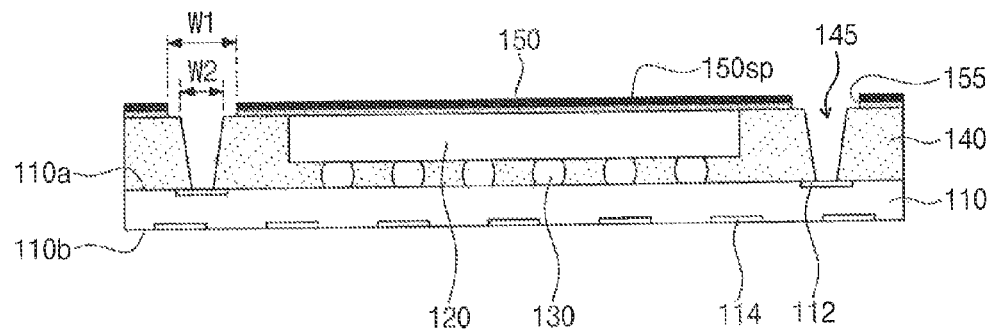

Referring to FIG. 6C, the exposed surface 140s of the mold layer 140 may be etched or drilled to form a mold hole 145 exposing the upper pad 112. The mold hole 145 has a second size W2 smaller than the first size W1. The mold hole 145 may have a circular shape in plan view. In this case, the second size W2 may be referred to as a second diameter.

Figure 6D:
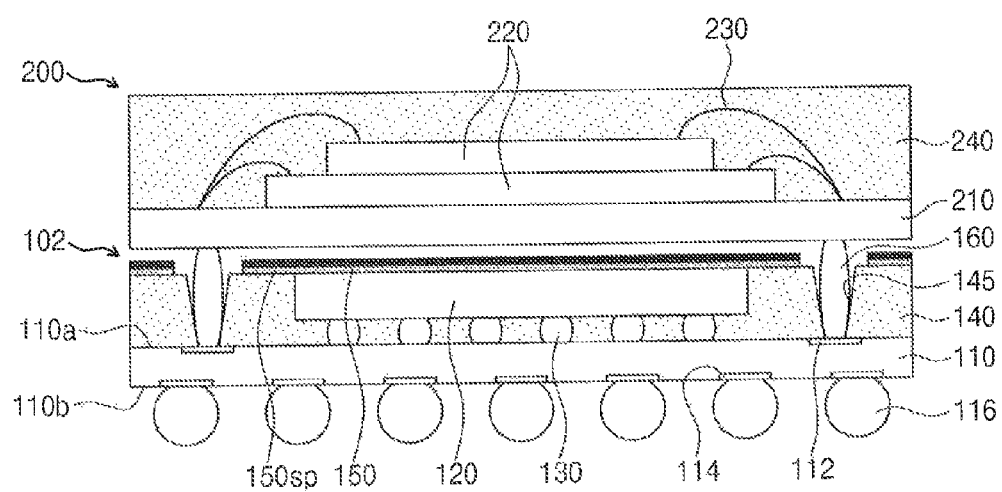

Referring to FIG. 6D, the connection terminal 160 is formed in the mold hole 145 to be coupled to the upper pad 112. The upper package 200 is stacked on the second lower package 102 to fabricate a second semiconductor package 12 of a package-on-package type. The residual stress layer 150 has the opening 155 through which the connection terminal 160 is formed without being in contact with the residual stress layer 150.

Figure 7A:
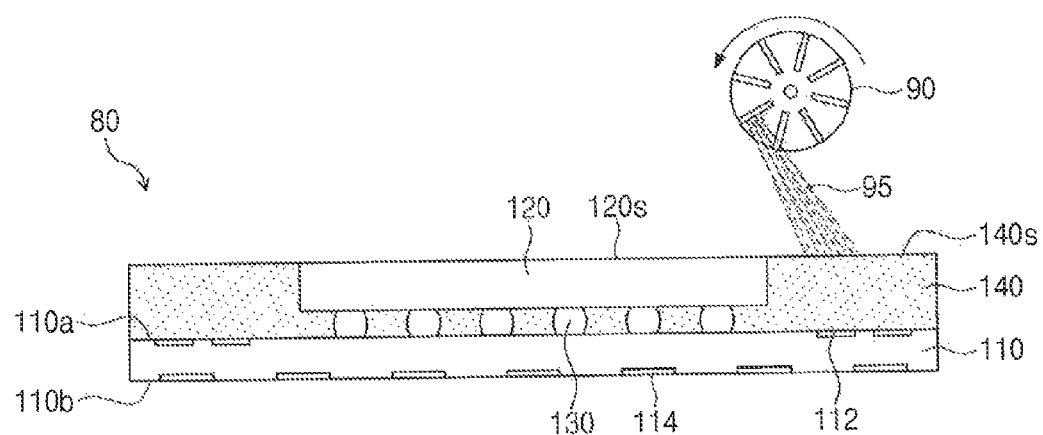
FIGS. 7A to 7D are cross sectional views illustrating a method of fabricating a semiconductor package according to an exemplary embodiment of the present inventive concept.
Figure 7B:
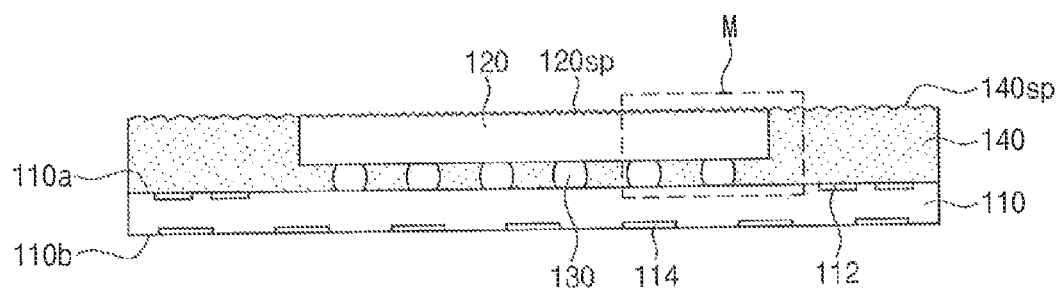
Figure 7C:
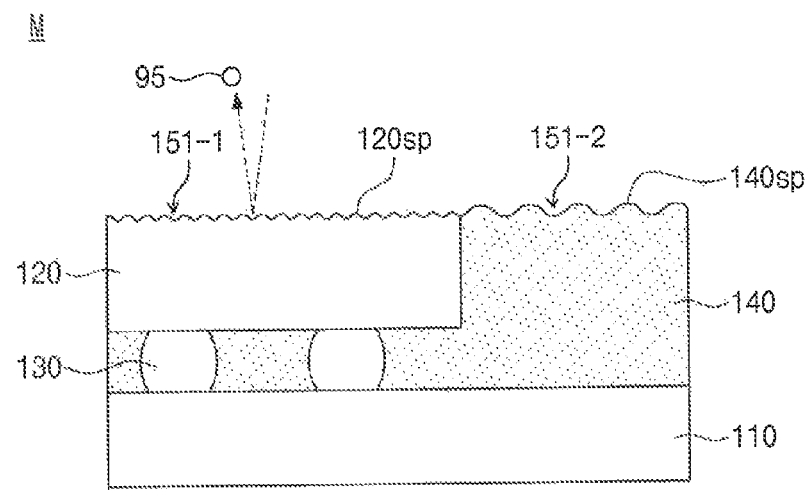

FIGS. 7A to 7D are cross sectional views illustrating a method of fabricating a semiconductor package according to an exemplary embodiment of the present inventive concept. FIG. 7C is an enlarged cross sectional view of a portion M of FIG. 7B.

Referring to FIG. 7A, the shot peening treatment is performed on a semiconductor package 80 which is formed using processes identical or similar to those described with reference to FIG. 1A. The semiconductor package 80 includes a package substrate 110, a semiconductor chip 120 on the upper surface 110a of the package substrate 110, and a mold layer 140 encapsulating the semiconductor chip 120. An upper pad 112 and a lower pad 114 are formed respectively on the upper surface 110a and the lower surface 110b of the package substrate 110. The surface 140s of the mold layer 140 is substantially coplanar with the surface 120s of the semiconductor chip 120. Both the surface 120s of the semiconductor chip 120 and the surface 140s of the mold layer 140 are subject to a shot peening treatment to receive the shots 95 from the injection apparatus 90.

Referring to FIG. 7B, the shot peening treatment causes the semiconductor chip 120 to have a shot-peening treated surface 120sp and also causes the mold layer 140 to have a shot-peeing treated surface 140sp. In this case, a third lower package 103 is formed to have an upper surface having a residual stress without forming the residual stress layer 150 of FIG. 1C.

As shown in FIG. 7C, the shot-peening treated surface 120sp of the semiconductor chip 120 is formed by high-speed impacts of the shots 95, having a dent 151-1 so that the surface roughness of the shot-peening treated surface 120sp increases. Similarly, the shot-peening treated surface 140sp of the mold layer 140 has a dent 151-2 which increases surface roughness of the shot-peening treated surface 140sp of the mold layer 140. Since the semiconductor chip 120 includes a hard material relative to the mold layer 140, the surface 120sp of the semiconductor chip 120 has roughness less than that of the surface 140sp of the mold layer 140. The surface 120sp of the semiconductor chip 120 and the surface 140sp of the mold layer 140s may be plastically deformed. The shot-peening treated surfaces 120sp and 140sp may serve as the residual stress layer 150 of FIG. 1C.

Figure 7D:
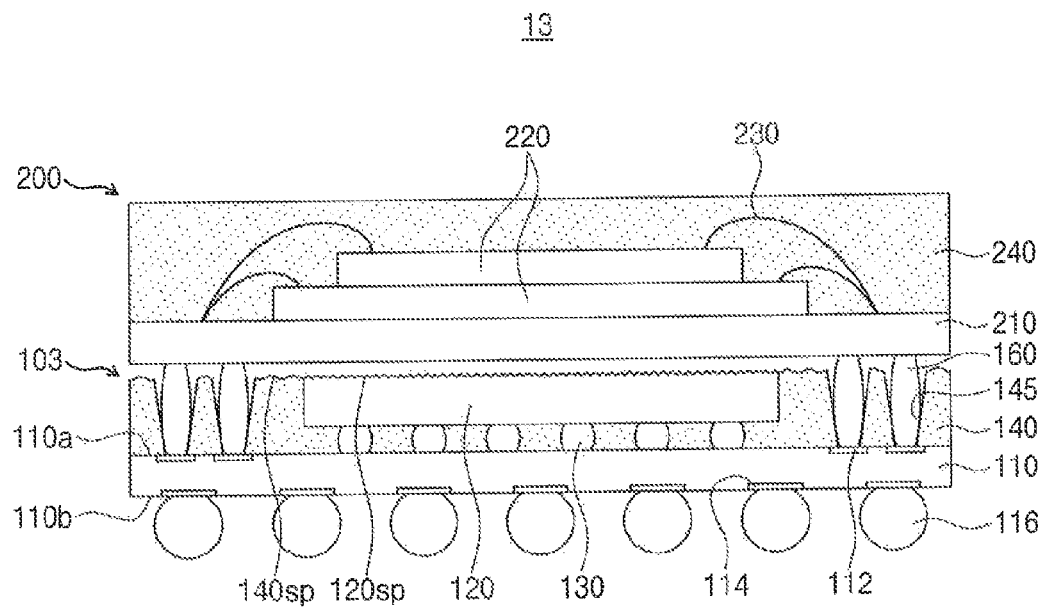

Referring to FIG. 7D, the shot-peening treated surface 140sp of the mold layer 140 may be etched or drilled to form the mold hole 145 exposing the upper pad 112. The connection terminal 160 is formed in the mold hole 145 to be coupled to the upper pad 112. The upper package 200 is stacked on the third lower package 103. The external terminal 116 is attached to the lower pad 114 to fabricate a third semiconductor package 13 of a package-on-package type. Alternatively, the mold layer 140 may completely cover the semiconductor chip 120, and thus the surface 120s of the semiconductor chip 120 is not be exposed. In this case, the shot-peening treated surface 140sp of the mold layer 140 is a part of an upper surface of the third lower package 103.

Figure 8A:
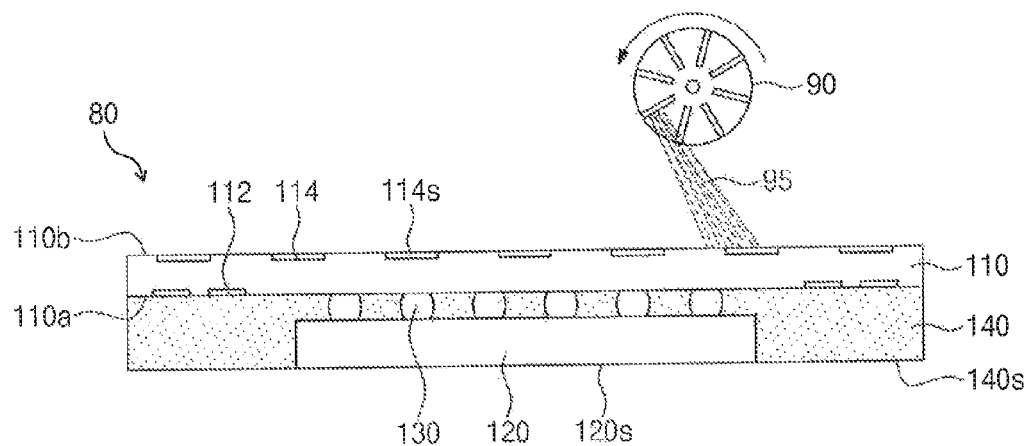
FIGS. 8A to 8D are cross sectional views illustrating a method of fabricating a semiconductor package according to an exemplary embodiment of the present inventive concept.
Figure 8B:
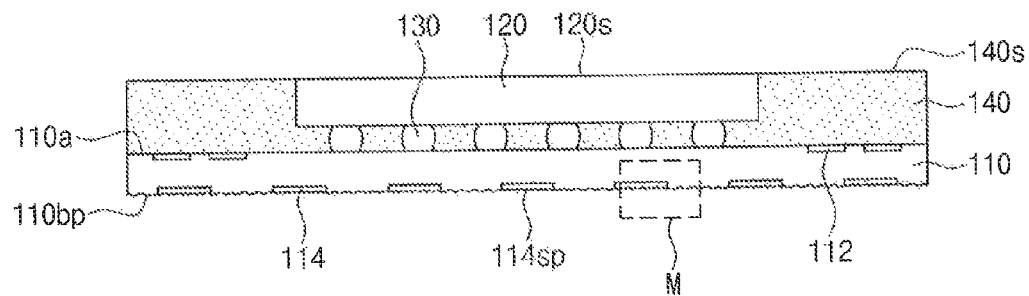
Figure 8C:
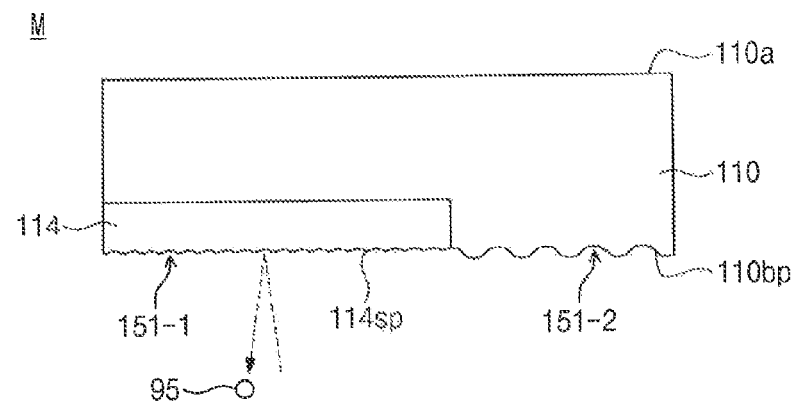

FIGS. 8A to 8D are cross sectional views illustrating a method of fabricating a semiconductor package according to an exemplary embodiment of the present inventive concept. FIG. 8C is an enlarged cross sectional view of a portion M of FIG. 8B.

Referring to FIG. 8A, the shot peening treatment may be performed to a semiconductor package 80 which is formed using processes identical or similar to those described with reference to FIG. 1A. The semiconductor package 80 includes a package substrate 110, a semiconductor chip 120 on the upper surface 110a of the package substrate 110, and a mold layer 140 encapsulating the semiconductor chip 120. An upper pad 112 and a lower pad 114 are formed respectively on the upper surface 110a and the lower surface 110b of the package substrate 110. The surface 140s of the mold layer 140 is substantially coplanar with the surface 120s of the semiconductor chip 120. In this case, the shot peening treatment is performed on the lower surface 110b of the package substrate 110. The lower surface 110b of the package substrate 110 receives the shots 95 from the injection apparatus 90. A surface 114s of the lower pad 114 is shot-peening treated together with the lower surface 110b of the package substrate 110.

Referring to FIG. 8B, the shot peening treatment causes the package substrate 110 to have a shot-peening treated lower surface 110bp and also causes the lower pad 114 to have a shot-peeing treated surface 114sp. Therefore, a fourth lower package 104 is formed to include the lower pad 114 having the shot-peening treated surface 114sp and the package substrate 110 having the shot-peening treated lower surface 110bp.

As shown in FIG. 8C, the shot-peening treated surface 114sp of the lower pad 114 is formed by high-speed impact of the shot 95. Dent 151-1 increases a surface roughness of the shot-peening treated surface 114p. Similarly, Dent 151-2 increases a surface roughness of the shot-peening treated lower surface 110bp. Since the lower pad 114 includes a hard material relative to the package substrate 110, the surface 114sp of the lower pad 114 has roughness less than that of the lower surface 110bp of the package substrate 110. The surface 114sp of the lower pad 114 and the surface 110bp of the package substrate 110 may be plastically deformed.

When the semiconductor package 80 has negative warpage, shot-peening treated surfaces 114sp and 110bp are formed on the lower surface 110b of the package substrate 110, as shown in FIG. 8A. For example, the shot-peening treated surface 110bp of the package substrate 110 and the shot-peening treated surface 114sp of the lower pad 114 may exert stress which can causes the fourth lower package 104 to have a positive warpage. When the fourth lower package 104 has negative warpage, the package substrate 110 having the shot-peening treated surfaces 110bp and 114sp may exert stress to counterbalance the negative warpage so that the warpage of the fourth lower package 104 may be reduced to the extent that the failure or damage of a connection terminal 160 may be prevented.

Figure 8D:
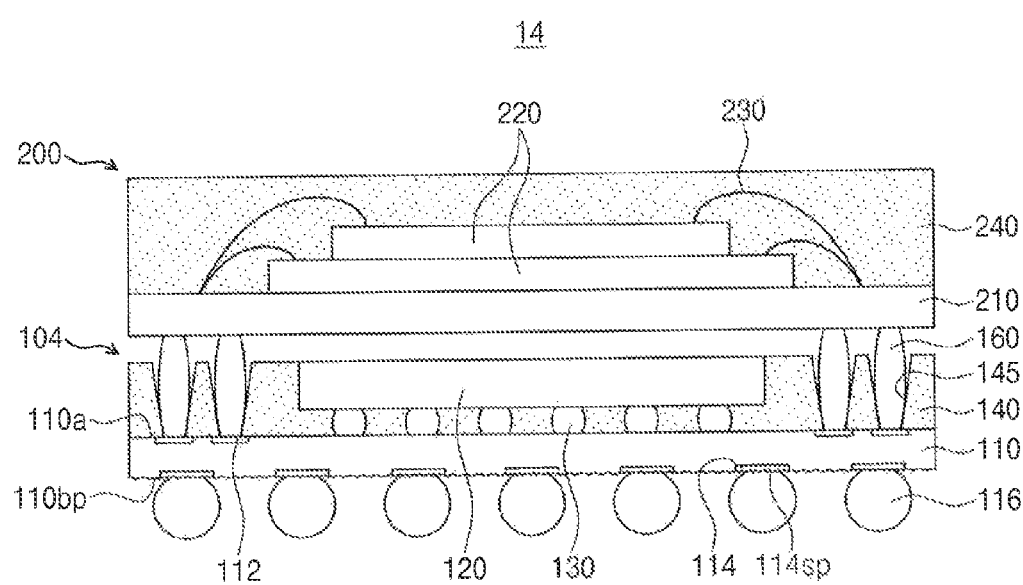

Referring to FIG. 8D, the mold layer 140 may be etched or drilled to form the mold hole 145 exposing the upper pad 112 of the package substrate 110. The connection terminal 160 is formed in the mold hole 145 to be coupled to the upper pad 112. The upper package 200 is stacked on the fourth lower package 104. The external terminal 116 is attached to the lower pad 114 to fabricate a fourth semiconductor package 14 of a package-on-package type.

FIGS. 9A to 9D are cross sectional views illustrating a method of fabricating a semiconductor package according to an exemplary embodiment of the present inventive concept.

Figure 9A:
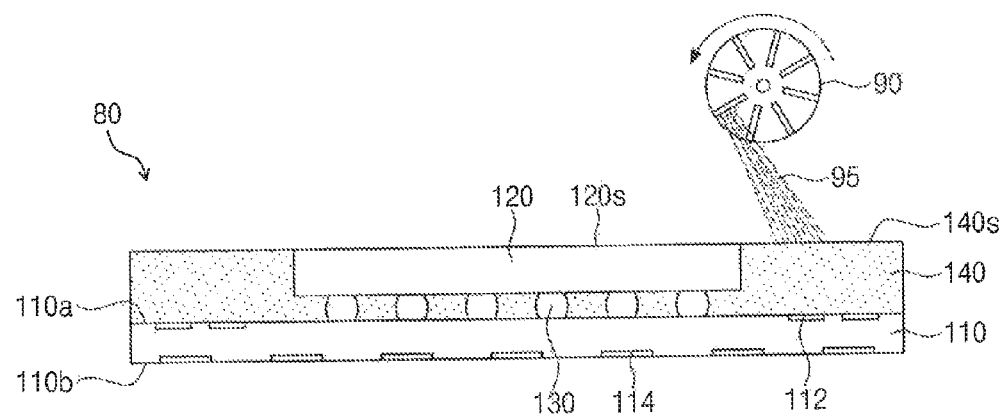
FIGS. 9A to 9D are cross sectional views illustrating a method of fabricating a semiconductor package according to an exemplary embodiment of the present inventive concept.

Referring to FIG. 9A, the shot peening treatment is performed on a semiconductor package 80 which may be formed using processes identical or similar to those described with reference to FIG. 1A. The semiconductor package 80 includes a package substrate 110, a semiconductor chip 120 on the upper surface 110*a* of the package substrate 110, and a mold layer 140 encapsulating the semiconductor chip 120. An upper pad 112 and a lower pad 114 are formed respectively on the upper surface 110*a* and the lower surface 110*b* of the package substrate 110. The surface 140*s* of the mold layer 140 is substantially coplanar with the surface 120*s* of the semiconductor chip 120. In this case, a first shot peening treatment is performed on the surface 120*s* of the semiconductor chip 120 and the surface 140*s* of the mold layer 140 by the shots 95 from the injection apparatus 90.

Figure 9B:
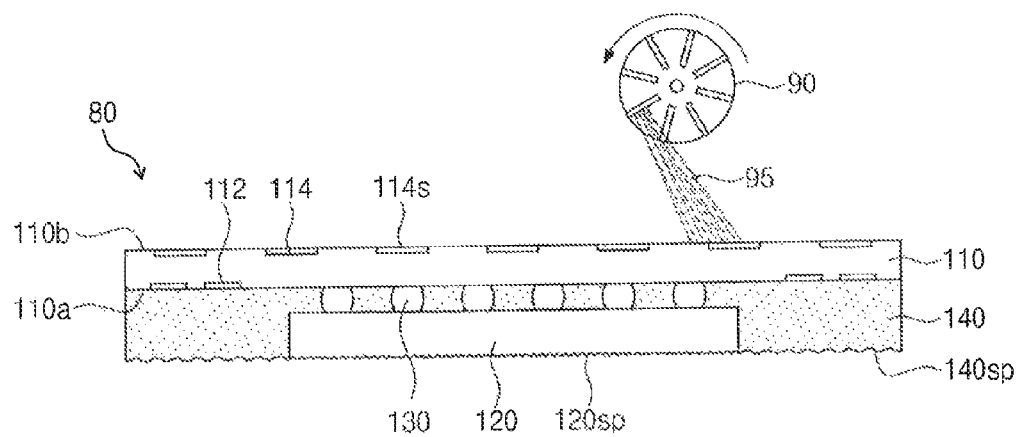

Referring to FIG. 9B, the first shot peening treatment causes the semiconductor chip 120 and the mold layer 140 to have a shot-peening treated surface 120*sp* and a shot-peening treated surface 140*sp*, respectively. Then, a second shot peening treatment is further performed on a lower side of the semiconductor package 80.

Figure 9C:
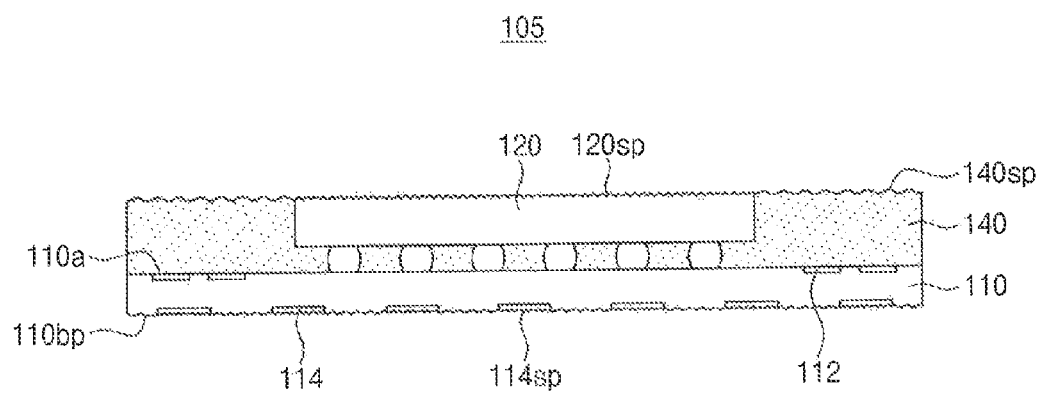

Referring to FIG. 9C, the second shot peening treatment causes the package substrate 110 and the lower pad 114 to have a shot-peening treated lower surface 110*bp* and a shot-peening treated surface 114*sp*, respectively. Consequently, a fifth lower package 105 is formed to have shot-peening treated surfaces on both sides of the fifth lower package 105, for example, upper and lower sides thereof.

The fifth lower package 105 has the upper and lower sides which are shot-peening treated, and the warpage of the fifth lower package 105 may be counterbalanced irrespective of warpage direction. For example, when the fifth lower package 105 has positive warpage at a high temperature condition, the surfaces 120*sp* of the semiconductor chip 120 and the surface 140*sp* of the mold layer 140 may provide the fifth lower package 105 with a residual stress to induce negative warpage which may eliminate or reduce the positive warpage. Alternatively, when the fifth lower package 105 has negative warpage at a high temperature condition, the lower surface 110*bp* of the package substrate 110 and the surface 114*sp* of the lower pad 114 may provide the fifth lower package 105 with a residual stress to induce positive warpage which may eliminate or reduce the negative warpage.

Magnitudes of the residual stresses exerted on the fifth lower package 105 may be controlled by adjusting process conditions of the shot peening treatment, for example, an impact velocity of the shot 95, a peening treatment time, etc.

Figure 9D:
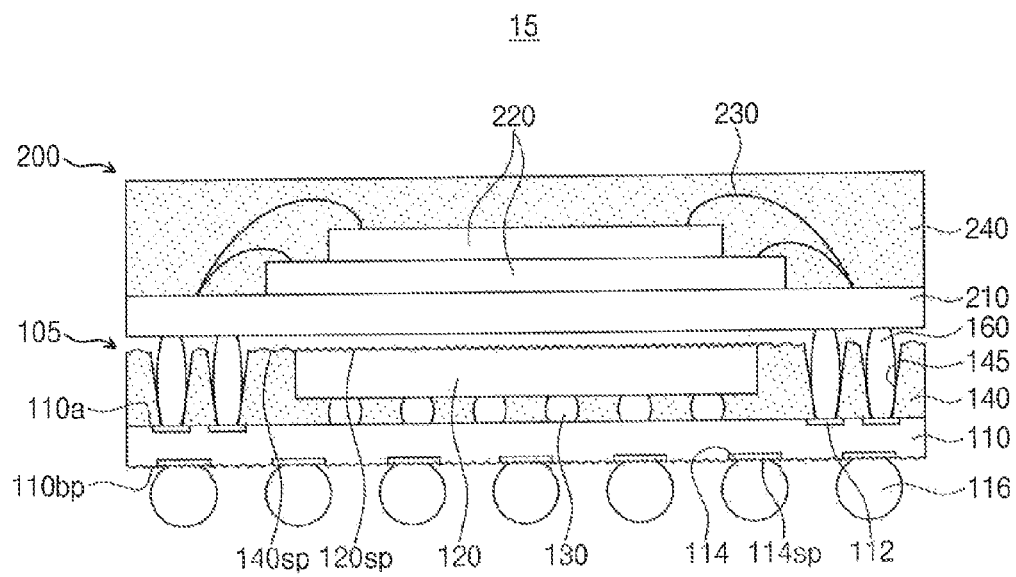

Referring to FIG. 9D, the shot peeing treated surface 140*sp* of the mold layer 140 may be etched or drilled to form a mold hole 145. The connection terminal 160 is formed in the mold hole 145 to be coupled to the upper pad 112. The upper package 200 is stacked on the fifth lower package 105.

The external terminal 116 is attached to the lower pad 114 to fabricate a fifth semiconductor package 15 of a package-on-package type. The shot-peening treated surface 14*sp* of the lower pad 114 has an increased contact area between the lower pad 114 and the external terminal 116, and thus adhesion between the lower pad 114 and the external terminal 116 may increase.

Figure 10A:
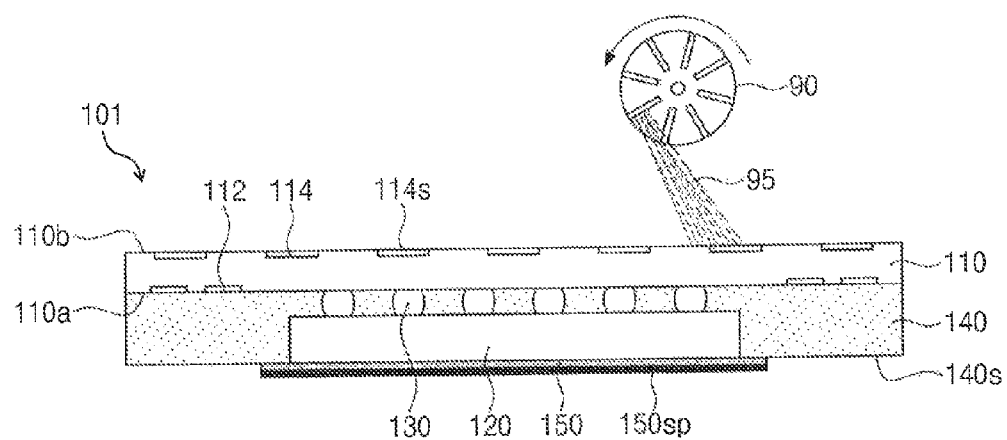
FIGS. 10A to 10C, are cross sectional views illustrating a method of fabricating a semiconductor package according to an exemplary embodiment of the present inventive concept.
Figure 10B:
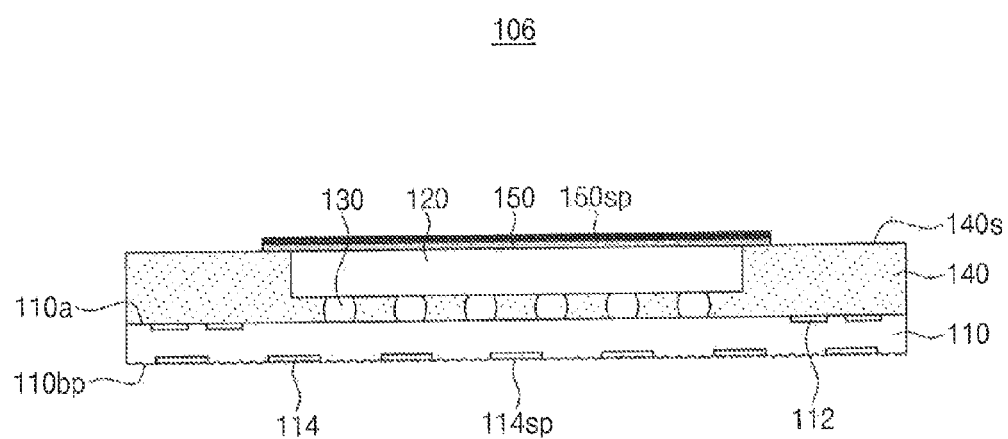
Figure 10C:
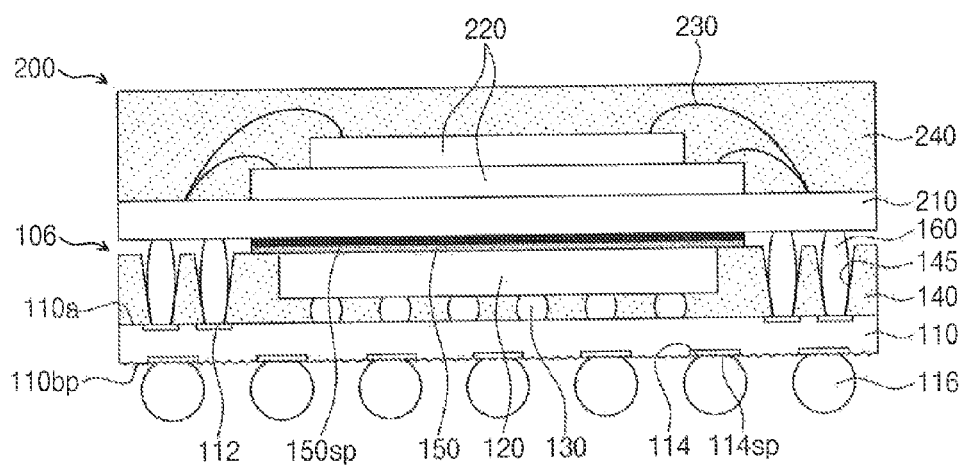
Figure 10D:
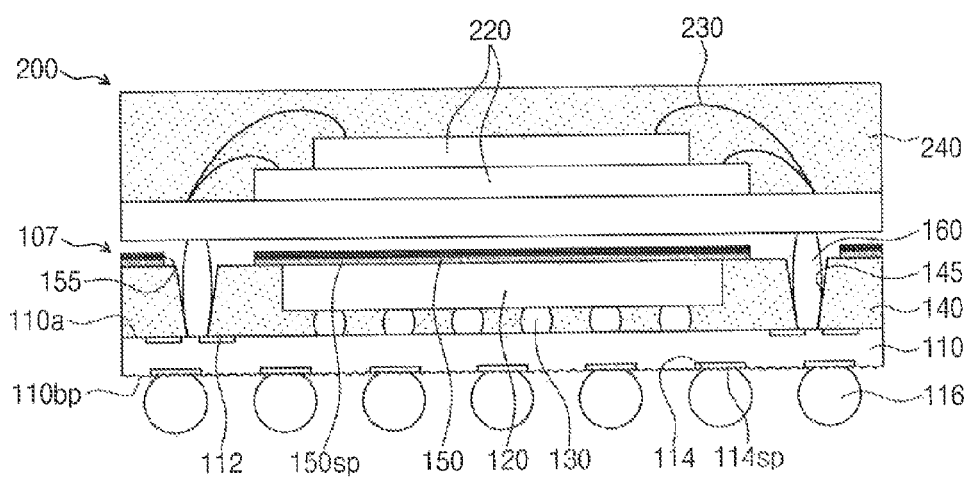
FIG. 10D is a cross sectional view illustrating a semiconductor package according to an exemplary embodiment of the present inventive concept.

FIGS. 10A to 10C are cross sectional views illustrating a method of fabricating a semiconductor package according to an exemplary embodiment of the present inventive concept. FIG. 10D is a cross sectional view illustrating a semiconductor package according to an exemplary embodiment of the present inventive concept.

Referring to FIG. 10A, before or after forming a first lower package 101 using processes identical or similar to those described with reference to FIGS. 5A and 5B, a shot peening treatment is performed on a lower side of the first lower package 101. In the shot peening treatment, the lower surface 110*b* of the package substrate 110 and the surface 114*s* of the lower pad 114 are subject to the collision of shot 95 ejected from an injection apparatus 90.

Referring to FIG. 10B, the shot peeing treatment causes the package substrate 110 and the lower pad 114 to have a shot-peening treated surface 110*bp* and a shot-peening treated surface 114*sp*, respectively. As a result, a sixth lower package 106 includes a residual stress layer 150 covering a semiconductor chip 120, the lower pad 114 having the shot-peening treated surface 114*sp*, and the package substrate 110 having the shot-peening treated lower surface 110*bp*. The residual stress layer 150 also covers a portion of the mold layer 140. The surface 114*sp* of the lower pad 114 may have roughness less than roughness of the lower surface 110*bp*

Regardless of warpage directions, the residual stress layer 150 and/or the shot-peening treated surfaces 114*sp* and 110*bp* may eliminate or reduce the warpage of the sixth lower package 106.

Referring to FIG. 10C, fabrication processes identical or similar to those described with referent to FIGS. 5B to 5D may be performed to fabricate a sixth semiconductor package 16 of a package-on-package type including an upper package 200 stacked on the sixth lower package 106.

Referring to FIG. 10D, a shot peening treatment may be performed on a lower side of the second lower package 102 of FIG. 6B to form a seventh lower package 107. The seventh lower package 107 includes the residual stress layer 150 having the opening 155, the lower pad 114 having the shot-peening treated surface 114*sp*, and the package substrate 110 having the shot-peening treated lower surface 110*bp*. The upper package 200 is stacked on the seventh lower package 107 to fabricate a seventh semiconductor package 17 of a package-on-package type.

FIGS. 11A to 11D are cross sectional views illustrating a method of fabricating a semiconductor package according to an exemplary embodiment of the present inventive concept. FIG. 11E is a cross sectional view illustrating a semiconductor package according to an exemplary embodiment of the present inventive concept.

Figure 11A:
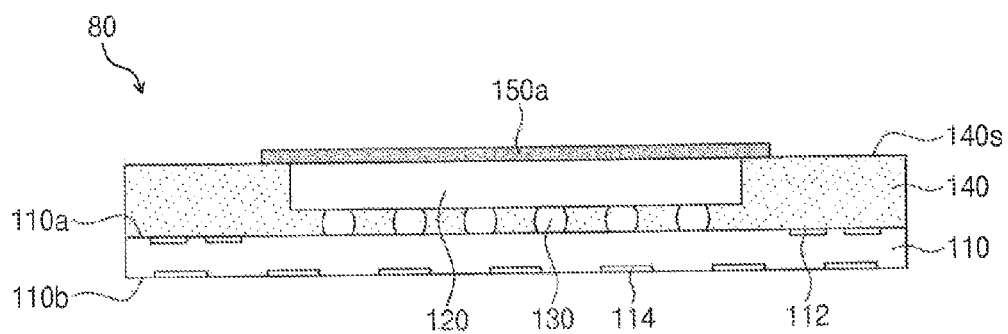
FIGS. 11A to 11D are cross sectional views illustrating a method of fabricating a semiconductor package according to an exemplary embodiment of the present inventive concept.

Referring to FIG. 11A, a semiconductor package 80 having a seed layer 150*a* formed thereon is provided. The semiconductor package 80 includes a package substrate 110, a semiconductor chip 120 mounted on the upper surface 110*a* of the package substrate 110, and a mold layer 140 encapsulating the semiconductor chip 120. An upper pad 112 is provided on the upper surface 110*a* of the package substrate 110, and a lower pad 114 is disposed on the lower surface 110*b* of the package substrate 110. The seed layer 150*a* partially covers the semiconductor package 80. For example, the seed layer 150*a* may be formed by depositing and etching metal to have a shape covering the semiconductor chip 120 and exposing the mold layer 140. The seed layer 150*a* also covers a portion of the mold layer 140. The surface 140*s* of the mold layer 140 is partially exposed.

Figure 11B:
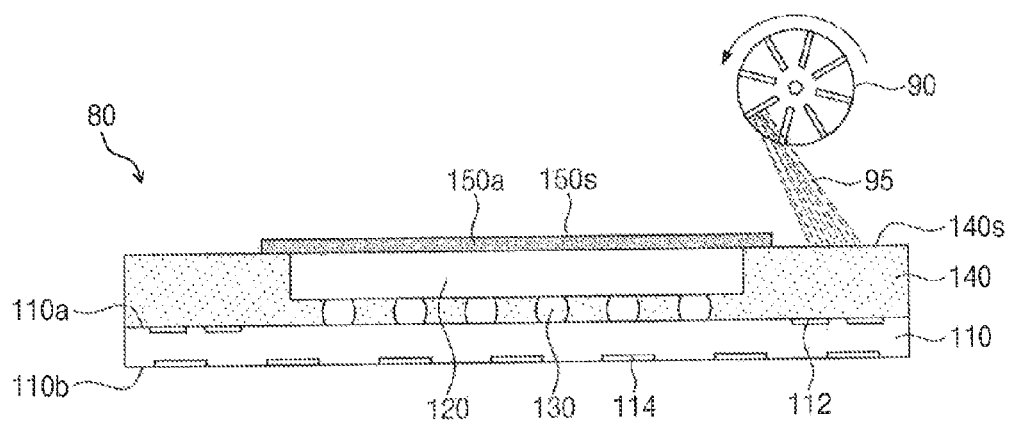

Referring to FIG. 11B, the semiconductor package 80 is subject to a shot peening treatment. For example, a shot 95 hit at a high speed against the surface 150*s* of the seed layer 150*a* and the surface 140*s* of the mold layer 140. The seed layer 150*a* and the mold layer 140 are simultaneously treated by a single shot peening treatment.

Figure 11C:
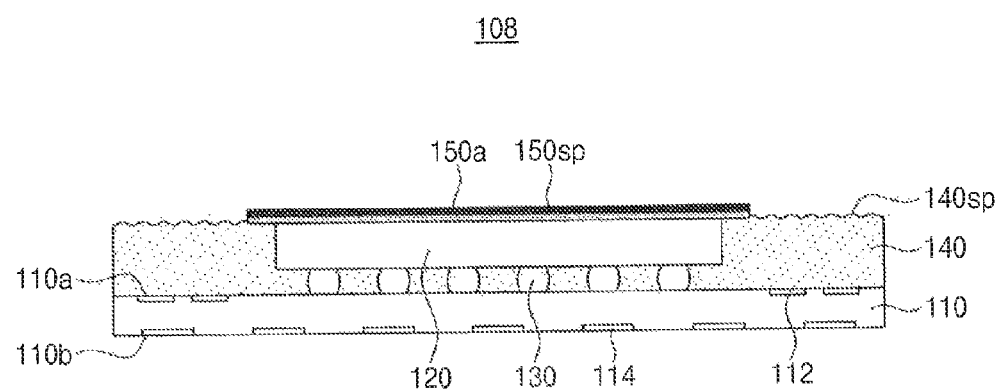

Referring to FIG. 11C, the shot peening treatment transforms the seed layer 150*a* into the residual stress layer 150 having a shot-peening treated surface 150*sp*. The mold layer 140 also has a shot-peening treated surface 140*sp*. As a result, an eighth lower package 108 is formed to have the residual stress layer 150 and the mold layer 140 which are shot-peening treated.

Figure 11D:
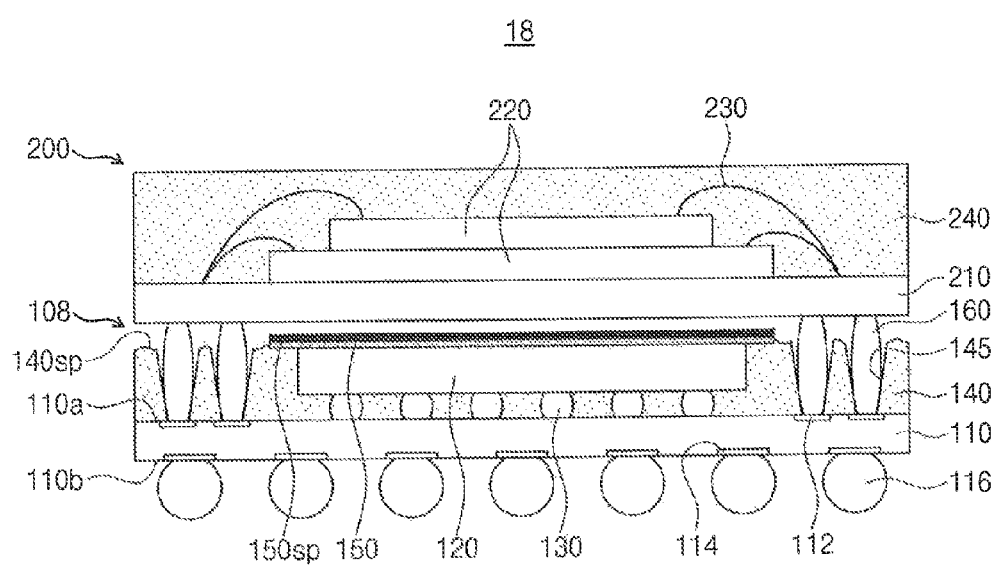
Figure 11E:
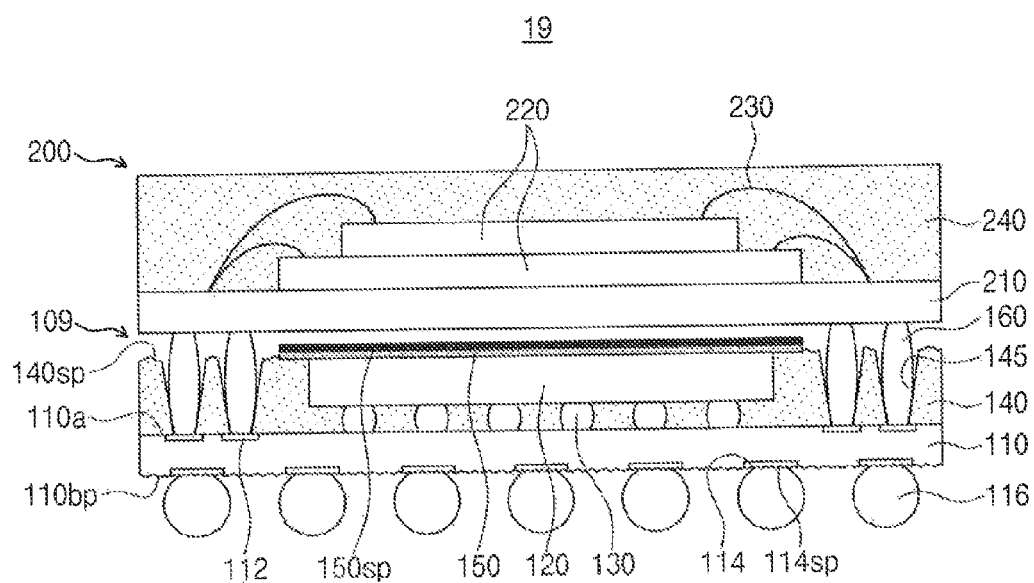
FIG. 11E is a cross sectional view illustrating a semiconductor package according to an exemplary embodiment of the present inventive concept.

Referring to FIG. 11D, the shot-peening treated surface 140*sp* of the mold layer 140 may be etched or drilled to form a mold hole 145 exposing an upper pad 112 of the package substrate 110. A connection terminal 160 is formed in the mold hole 145 to be coupled to the upper pad 112. An upper package 200 is stacked on the eighth lower package 108 and an external terminal 116 is attached to the lower pad 114 to fabricate an eighth semiconductor package 18 of a package-on-package type.

Referring to FIG. 11E, a shot peening treatment is also performed on a lower side of the eighth lower package 108 of FIG. 11C to form a ninth lower package 109. In this case, the ninth lower package 109 includes the residual stress layer 150, the lower pad 114 having a shot-peening treated surface 114*sp*, and the package substrate 110 having a shot-peening treated lower surface 110*bp*. An upper package 200 is stacked on the ninth lower package 109 to fabricate a ninth semiconductor package 19 of a package-on-package type.

Figure 12A:
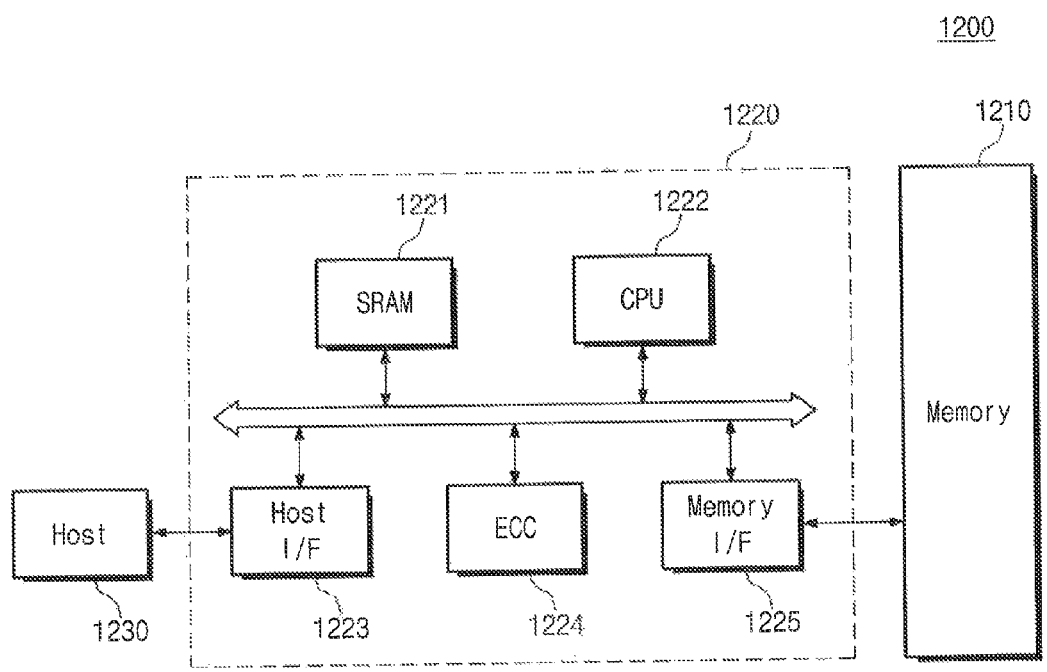
FIG. 12A is a schematic block diagram illustrating an exemplary memory card including a semiconductor package according to an exemplary embodiment of the present inventive concept.

FIG. 12A is a schematic block diagram illustrating an exemplary memory card including a semiconductor package according to an exemplary embodiment of the present inventive concept.

Referring to FIG. 12A, a memory card 1200 includes a memory 1210 and a memory controller 1220. The memory 1210 may include a semiconductor package according to an exemplary embodiment of the inventive concept. The memory controller 1220 may control data exchange between a host 1230 and the memory 1210. A static random access memory (SRAM) device 1221 may serve as a work memory of a central processing unit 1222. A host interface 1223 may have a data exchange protocol of a host connected to the memory card 1200. An error correction coding block 1224 may detect and correct errors of data that are read from the memory 1210. A memory interface 1225 may interface the memory 1210. The central processing unit 1222 may control data exchange of the memory controller 1220.

Figure 12B:
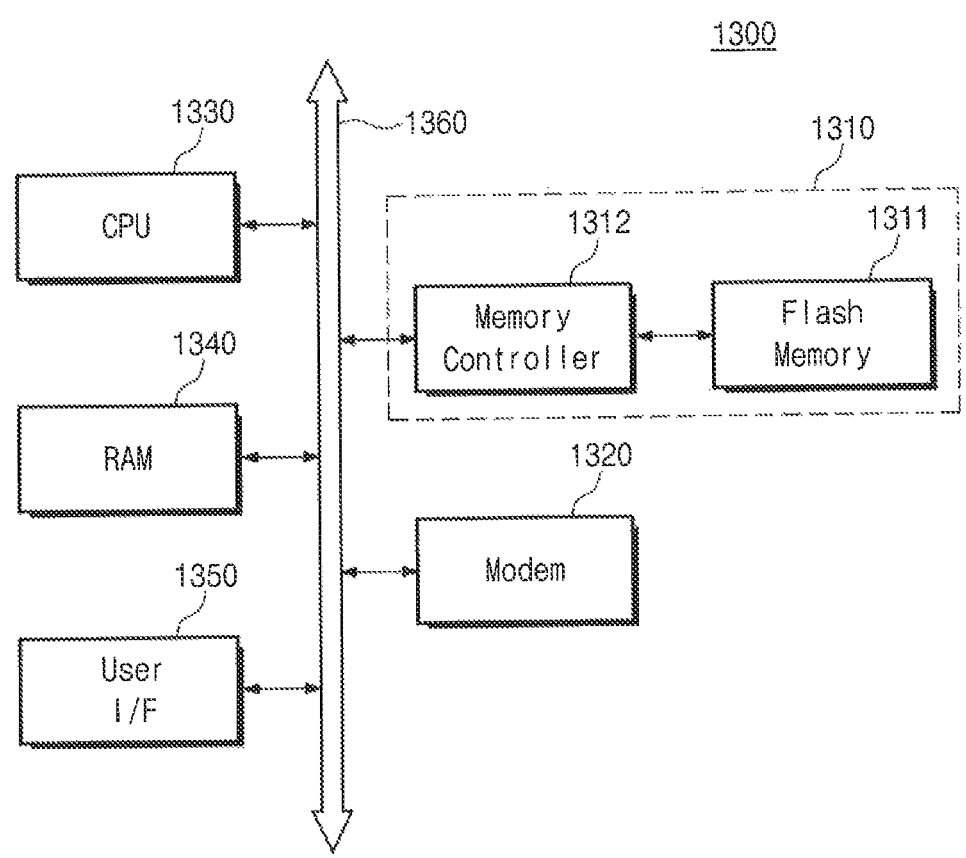
FIG. 12B is a schematic block diagram illustrating an exemplary information process system including a semiconductor package according to an exemplary embodiment of the present inventive concept.

FIG. 12B is a schematic block diagram illustrating an exemplary information process system including a semiconductor package according to an exemplary embodiment of the present inventive concept.

Referring to FIG. 12B, an information processing system 1300 includes a memory system 1310 having a semiconductor package according to an exemplary embodiment of the inventive concept. The information processing system 1300 may include a mobile device or a computer. For example, the information processing system 1300 may include a modem 1320, a central processing unit 1330, a RAM 1340, and a user interface 1350 electrically connected to the memory system 1310 via a system bus 1360. The memory 1310 including a memory 1311 and a memory controller 1312 may have substantially the same configuration as that of the memory card 1200 in FIG. 12A.

The memory system 1310 may store data processed by the central processing unit 1330 or data input from the outside. The information process system 1300 may be provided as a memory card, a solid state disk, a semiconductor device disk, a camera image sensor, or other application chipsets. For example, the memory system 1310 may be used as a portion of a solid state drive (SSD), and in this case, the information processing system 1300 may store a large amount of data in the memory system 1310.

According to an exemplary embodiment of the present invention, the shot peening treatment is used to form a residual stress or cause a semiconductor to have a residual stress therein to prevent warpage of a semiconductor package. Such residual stress may suppress warpage of a semiconductor package. The mechanical and/or electrical reliability of the semiconductor package may increase.

While the present inventive concept has been shown and described with reference to exemplary embodiments thereof, it will be apparent to those of ordinary skill in the are that various changes in form and detail may be made therein without departing from the spirit and scope of the inventive concept as defined by the following claims.

What is claimed is:

1. A semiconductor package comprising a lower package and an upper package stacked on the lower package, wherein the lower package includes:
   a package substrate having upper and lower surfaces;
   a semiconductor chip disposed on the upper surface of the package substrate;
   a mold layer encapsulating the semiconductor chip; and
   a residual stress layer disposed on the semiconductor chip,
   wherein the residual stress layer includes a plastically deformed surface,
   wherein the residual stress layer has a residual stress to counterbalance warpage of the lower package.

2. The semiconductor package of claim 1,
   wherein the semiconductor chip includes an exposed surface not covered by the mold layer, and
   the residual stress layer is in contact with the exposed surface of the semiconductor chip.

3. The semiconductor package of claim 2,
   wherein the plastically deformed surface of the residual stress includes a plurality of first dents.

4. The semiconductor package of claim 3,
   wherein the plastically deformed surface of the residual stress layer has a first roughness, and
   an upper surface of the mold layer has a second roughness less than the first roughness.

5. The semiconductor package of claim 3,
   wherein an upper surface of the mold layer includes a plurality of second dents.

6. The semiconductor package of claim 5,
   wherein the plastically deformed surface includes a first roughness caused by the plurality of first dents, and
   the upper surface of the mold layer includes a second roughness caused by the plurality of second dents, and
   the second roughness is greater than the first roughness.

7. The semiconductor package of claim 2,
   wherein an upper surface of the mold layer is substantially coplanar with the exposed surface of the semiconductor chip, and the residual stress layer further extends onto the upper surface of the mold layer.

8. The semiconductor package of claim 1, wherein the lower surface of the package substrate includes a plurality of third dents.

9. The semiconductor package of claim 8, wherein the package substrate further comprises a pad, wherein a surface of the pad is a part of the lower surface of the package substrate.

10. The semiconductor package of claim 9, wherein a roughness of the surface of the pad is less than a roughness of the lower surface other than the surface of the pad.

11. A semiconductor package comprising:
a lower package including a lower semiconductor chip, a lower package substrate and a lower mold layer,
   wherein the lower semiconductor chip is mounted on the lower package substrate and the lower mold layer encapsulates the lower semiconductor chip; an upper package stacked on the lower package,
   wherein the upper package includes an upper semiconductor chip, an upper package substrate and an upper mold layer and
   wherein the upper semiconductor chip is mounted on the upper package substrate and the upper mold layer encapsulates the upper semiconductor chip; and
a residual stress layer,
   wherein the residual stress layer is in contact with the lower package, and
   wherein the residual stress layer includes a plurality of first dents.

12. The semiconductor package of claim 11, wherein the residual stress layer is interposed between the lower package and the upper package.

13. The semiconductor package of claim 12, wherein the lower semiconductor chip includes an exposed surface,
wherein the exposed surface of the lower semiconductor chip is not covered by the lower mold layer and faces the upper package, and
wherein the residual stress layer covers the exposed surface of the lower semiconductor chip.

14. The semiconductor package of claim 13, wherein the lower mold layer includes an upper surface substantially coplanar with the exposed surface of the lower semiconductor chip, and
wherein the residual stress layer further covers at least a portion of the upper surface of the lower mold layer.

15. The semiconductor package of claim 13, wherein an upper surface of the lower mold layer includes a plurality of second dents,
wherein a roughness of the upper surface of the lower mold layer is greater than a roughness of a surface of the residual stress layer, and
wherein the surface of the residual stress layer faces the upper package.

16. The semiconductor package of claim 11, further comprising:
a plurality of second dents formed on an upper surface of the lower mold layer.

17. The semiconductor package of claim 16, further comprising:
a plurality of third dents formed on a lower surface of the lower package substrate.

18. The semiconductor package of claim 11, wherein the residual stress layer is formed of metal.

19. The semiconductor package of claim 11, wherein the residual stress layer has a residual stress to counterbalance warpage of the lower package.

20. A semiconductor package comprising:
a lower package; and
an upper package stacked on the lower package,
wherein the lower package includes a surface having a plurality of dents,
wherein the lower package includes:
   a lower semiconductor chip,
   a lower package substrate and
   a lower mold layer,
wherein the lower semiconductor chip is mounted on an upper surface of the lower package substrate and the lower mold layer encapsulates the lower semiconductor chip,
wherein the plurality of dents includes a plurality of first dents formed on an upper surface of the lower semiconductor chip and a plurality of second dents formed on an upper surface of the lower mold layer,
wherein the plurality of first dents has a first roughness and the plurality of second dents has a second roughness greater than the first roughness,
wherein the plurality of dents faces the upper package, and
wherein a lower surface of the lower package substrate includes a plurality of third dents.

* * * * *